(12) United States Patent
Vishweshwara et al.

(10) Patent No.: US 10,812,098 B1
(45) Date of Patent: Oct. 20, 2020

(54) ANALOG-TO-DIGITAL CONVERTER DECISION CONTROL

(71) Applicant: TEXAS INSTRUMENTS INCORPORATED, Dallas, TX (US)

(72) Inventors: Ramamurthy Vishweshwara, Bengaluru (IN); Pramod Kumar Baskar, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/454,335

(22) Filed: Jun. 27, 2019

(51) Int. Cl.
| | |
|---|---|
| H03M 1/34 | (2006.01) |
| H03M 1/46 | (2006.01) |
| H03M 1/12 | (2006.01) |
| H03M 1/66 | (2006.01) |
| H03M 1/36 | (2006.01) |
| G05F 3/02 | (2006.01) |

(52) U.S. Cl.
CPC ......... *H03M 1/462* (2013.01); *H03M 1/1245* (2013.01); *H03M 1/466* (2013.01); *G05F 3/02* (2013.01); *H03M 1/12* (2013.01); *H03M 1/365* (2013.01); *H03M 1/66* (2013.01)

(58) Field of Classification Search
CPC .......... H03M 1/66; H03M 1/12; H03M 1/365; G05F 3/02
USPC .......... 341/144, 155, 159; 327/530
See application file for complete search history.

(56) References Cited

U.S. PATENT DOCUMENTS

2012/0306676 A1\* 12/2012 Balasubramaniam ....... H03M 1/0678
341/144

OTHER PUBLICATIONS

Texas Instruments. "ADS92x4R Dual, Low Latency, Simultaneous-Sampling SAR ADC." SBAS876—Aug. 2018. 19 pages.

\* cited by examiner

*Primary Examiner* — Joseph J Lauture
(74) *Attorney, Agent, or Firm* — John R. Pessetto; Charles A. Brill; Frank D. Cimino

(57) ABSTRACT

An analog-to-digital converter (ADC) includes a capacitive digital-to-analog converter (CDAC), a comparator, and a successive approximation register (SAR) control circuit. The comparator is coupled to an output of the CDAC. The SAR control circuit is coupled to an output of the comparator and to an input of the CDAC. The SAR control circuit includes a flip-flop. The flip-flop includes a clock input terminal, a data input terminal, and an output. The clock input terminal is coupled to the output of the comparator. The data input terminal coupled to a constant voltage source. The flip-flop can include an enable input terminal coupled to a SAR state circuit. The output is coupled to the CDAC.

17 Claims, 6 Drawing Sheets

ANALOG-TO-DIGITAL CONVERTER DECISION CONTROL

BACKGROUND

Various analog-to-digital data converters and conversion techniques are available for converting electrical signals from an analog domain to a digital domain. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample. The number of iterations typically affects the noise level of any result as well as the resolution of the ultimate digital signal.

The successive approximation register (SAR) converter is one example of an analog-to-digital converter (ADC). The SAR ADC performs a binary search for the digital value that best corresponds to the voltage of an analog signal. In a SAR ADC, a voltage input is compared with one half of a voltage reference. If the voltage input is greater than one half of the voltage reference, a logic '1' is stored in a register. Alternatively, if the voltage input is less than one half of the voltage reference, a logic '0' is stored in the register. Next, if the previous comparison indicated that voltage input is greater than one half of the voltage reference, the voltage input is compared with three-quarters of the voltage reference. Again, where the comparison indicates a greater than condition, then a logic '1' is stored in the register. In contrast, if the comparison indicates a less than condition, then a logic '0' is stored in the register. Alternatively, if the previous comparison indicated that voltage input is less than one half of the voltage reference, then voltage input is compared with one quarter of the voltage reference. Again, if the comparison indicates a greater than condition, then a logic '1' is stored in the register. In contrast, if the comparison indicates a less than condition, then a logic '0' is stored in the register. This process is continued for lower order multiples of the voltage reference. As will be appreciated, the aforementioned process is capable of providing an ADC result with high resolution in a relatively small amount of time. In particular, only a single iteration can be used to produce each bit of resolution. For example, for a ten-bit resolution only ten iterations are required, and for twenty bits of resolution only twenty iterations are required.

SUMMARY

Circuitry for reducing the time to provide decision feedback to a capacitive digital-to-analog converter (CDAC) of a successive approximation register (SAR) analog-to-digital converter (ADC), and reducing the conversion time of the ADC, is disclosed herein. In one example, an ADC includes a CDAC, a comparator and a SAR control circuit. The comparator is coupled to an output of the CDAC. The SAR control circuit is coupled to an output of the comparator and to an input of the CDAC. The SAR control circuit includes a flip-flop. The flip-flop includes a clock input terminal, a data input terminal, an enable input terminal, and an output. The clock input terminal is coupled to the output of the comparator. The data input terminal coupled to a constant voltage source. The enable input terminal is coupled to a SAR state circuit. The output is coupled to the CDAC.

In another example, a CDAC circuit includes a CDAC and a control circuit. The CDAC includes a plurality of capacitors, and a plurality of switches. The switches are coupled to the capacitors. The control circuit is coupled to the CDAC. The control circuit includes a flip-flop. The flop-flop includes a clock input terminal, a data input terminal, an enable input terminal, and an output. The clock input terminal is coupled to an output of a comparator. The data input terminal is coupled to a constant voltage source. The enable input terminal is coupled to a CDAC state circuit. The output is coupled to a first of the switches.

In a further example, a method includes comparing, by a comparator circuit, output of a first CDAC and output of a second CDAC. The method also includes applying a signal generated at an output of the comparator circuit as a clock signal to clock a constant value into a flip-flip. The method further includes routing an output signal generated by the flip-flop to the CDAC, wherein the output signal controls switching of a reference voltage to a capacitor of the CDAC.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Some successive approximation register (SAR) analog-to-digital converters (ADCs) include capacitive digital-to-analog converters to generate the analog signals that are compared as part of the binary search for the ADC's digital output value. The switching of reference voltages to the CDACs during the conversion process is controlled by digital circuitry. The outputs of the digital circuitry are a function of the results of comparison of the CDAC outputs. Thus, in a SAR ADC the time from one bit-decision to the next bit-decision (and the overall conversion rate) is limited by the time required for the digital circuitry to change the control signals provided to the reference voltage switches of the CDACs.

The CDAC control circuitry disclosed herein reduces the time required, by the digital circuitry that controls the CDACs, to generate control signals for a next CDAC bit comparison. Implementations of the control circuitry improve the decision feedback timing by eliminating flip-flop setup time delays in the flip-flops of the control circuitry that stores next bit control signals. For example, if an implementation of the control circuitry eliminates 1.5 nanoseconds (ns) of setup time per bit decision, then the total conversion time may be reduced by 1.5 ns time the number of bits converted, or the 1.5 ns may be added to the settling time of the CDAC in each bit cycle to improve conversion accuracy.

Figure 1:
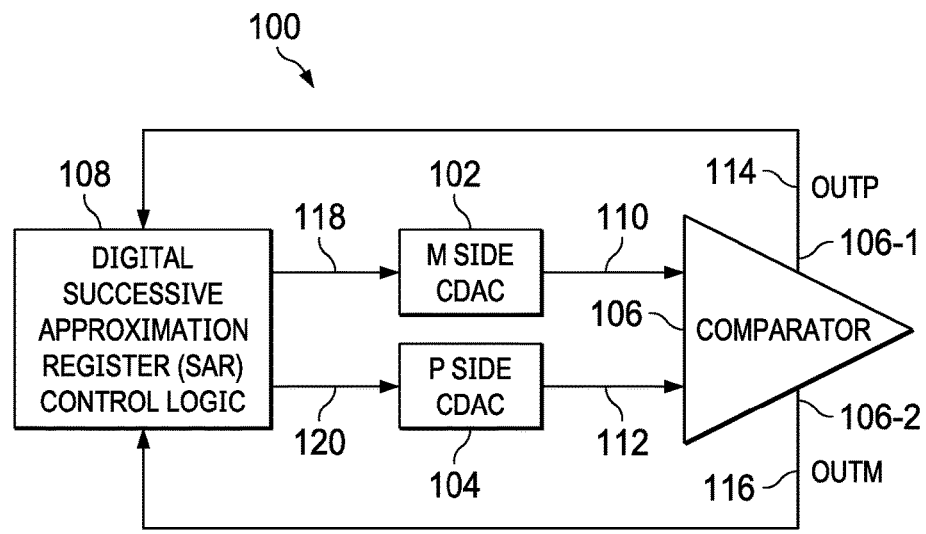
FIG. 1 shows a block diagram for an example successive approximation register (SAR) analog-to-digital converter (ADC) in accordance with the present disclosure.

FIG. 1 shows a block diagram for an example SAR ADC 100 in accordance with the present disclosure. The SAR ADC 100 includes a CDAC 102, a CDAC 104, a comparator 106, and a SAR control circuit 108. The CDAC 102 and the CDAC 104 are coupled to the comparator 106 and the SAR control circuit 108. The CDAC 102 generates an analog output signal 110 based on the charge stored in capacitors of the CDAC 102. Similarly, the CDAC 104 generates an analog output signal 112 based on the charge stored in capacitors of the CDAC 104. The comparator 106 compares the analog output signal 110 and the analog output signal 112 and generates output signal 114 and output signal 116 based on the comparison. The output signal 114 indicates that the analog output signal 112 is greater than the analog output signal 110, and the output signal 116 indicates that the analog output signal 110 is greater than the analog output signal 112. The SAR control circuit 108 receives the output signal 114 and the output signal 116 and generates, based on the output signal 114 and the output signal 116, control signals 118 and control signals 120. The control signals 118 set the state of switches in the CDAC 102, where changing the state of the switches in the CDAC 102 changes the voltage of the analog output signal 110. Similarly, the control signals 120 set the state of switches in the CDAC 104, where changing the state of the switches in the CDAC 104 changes the voltage of the analog output signal 112.

Thus, in the SAR ADC 100, control of the CDAC 102 and the CDAC 104 is based on feedback that generates control signals 118 and control signals 120 based on the analog output signal 110 of the CDAC 102 and the analog output signal 112 of the CDAC 104. The SAR control circuit 108 includes circuitry that reduces the time needed to generate the control signals 118 and the control signals 120 based on the output signal 114 and the output signal 116, thereby allowing the overall conversion time of the SAR ADC 100 to be reduced.

Figure 2:
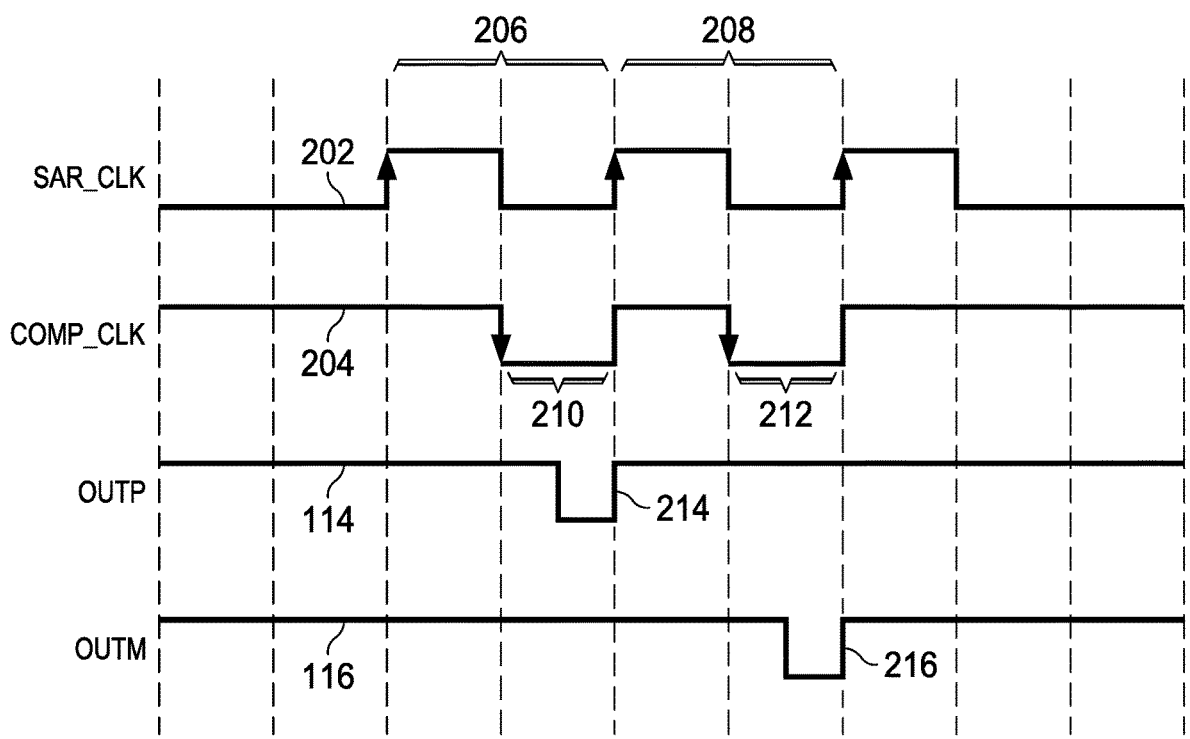
FIG. 2 shows an example timing diagram illustrating operation of the comparator in the SAR ADC of FIG. 1.

FIG. 2 shows an example timing diagram illustrating operation of the comparator 106 in the SAR ADC 100. The SAR_CLK 202 controls the timing bit decisions in the SAR ADC 100. In each cycle of the SAR_CLK 202, the value of a bit of the digital output value generated by the SAR ADC 100 is determined. In cycle 206, the value of a first bit is determined, and in cycle 208, the value of a second bit is determined. COMP_CLK 204 controls the comparator 106. The comparator 106 generates an output signal when the COMP_CLK 204 is low. In interval 210, the COMP_CLK 204 is low and the comparator 106 provides pulse 214 on the output signal 114, indicating that the analog output signal 112 is greater than the analog output signal 110. In interval 212, the COMP_CLK 204 is low and the comparator 106 provides pulse 216 on the output signal 116, indicating that the analog output signal 110 is greater than the analog output signal 112. At any given time, the comparator 106 will generate a pulse on either the output signal 114 or the output signal 116, but not both.

Figure 3:
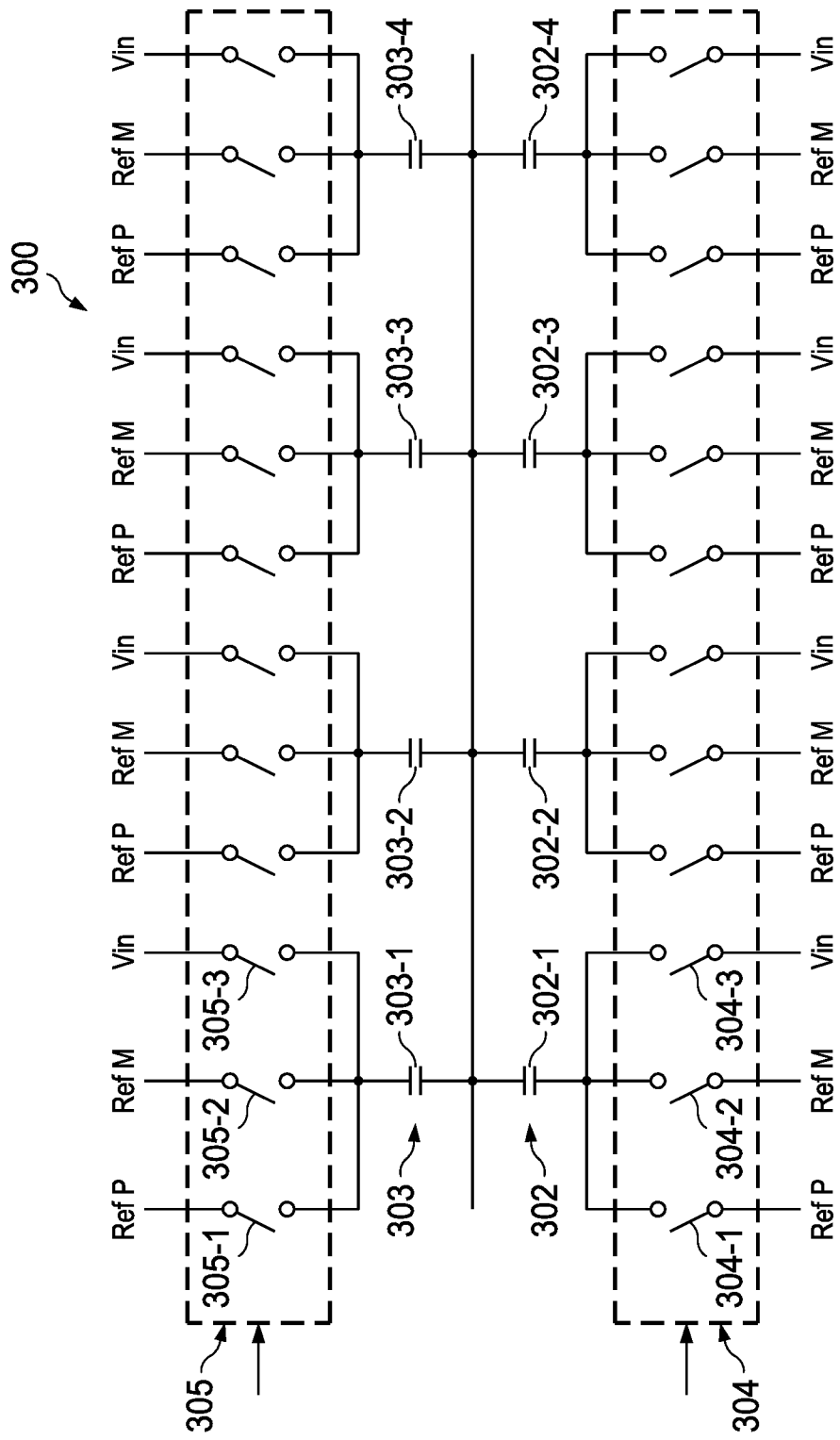
FIG. 3 shows schematic level diagram for a portion of an example capacitive digital-to-analog converter (CDAC) suitable for use in a SAR ADC in accordance with the present disclosure.

FIG. 3 shows schematic level diagram for a portion of an example CDAC 300 suitable for use in the SAR ADC 100. The CDAC 300 includes a plurality of capacitors 302 and a plurality of capacitors 303, where one capacitor 302 and one capacitor 303 operate as a pair. The capacitor 302-1 is paired with the capacitor 303-1, the capacitor 302-2 is paired with the capacitor 303-2. the capacitor 302-3 is paired with the capacitor 303-3, and the capacitor 302-4 is paired with the capacitor 303-4. The top plates of the capacitors 302 and the capacitors 303 are connected.

Switches couple the bottom plate of each of the capacitors 302 and each of the capacitors 303 to a first reference voltage (RefP), a second reference voltage (RefM), or a voltage to be digitized (Vin). For example, the bottom plate of the capacitor 302-1 is coupled to RefP by switch 304-1, to RefM by switch 304-2, and to Vin by switch 304-3. Similarly, the bottom plate of the capacitor 303-1 is coupled to RefP by switch 305-1, to RefM by switch 305-2, and to Vin by switch 305-3. Control signals 118 (or control signals 120) generated by the SAR control circuit 108 control the switches 304 and the switches 305. During the digitization process, some switches 304 and switches 305 may connect the corresponding capacitor 302 or 303 to RefP, and some switches 304 and switches 305 may connect the corresponding capacitor 302 or 303 to RefM, depending on the voltage of the signal VIN being digitized. The SAR control circuit 108 provides a control signal control (or control signal 120) for each switch.

Figure 4:
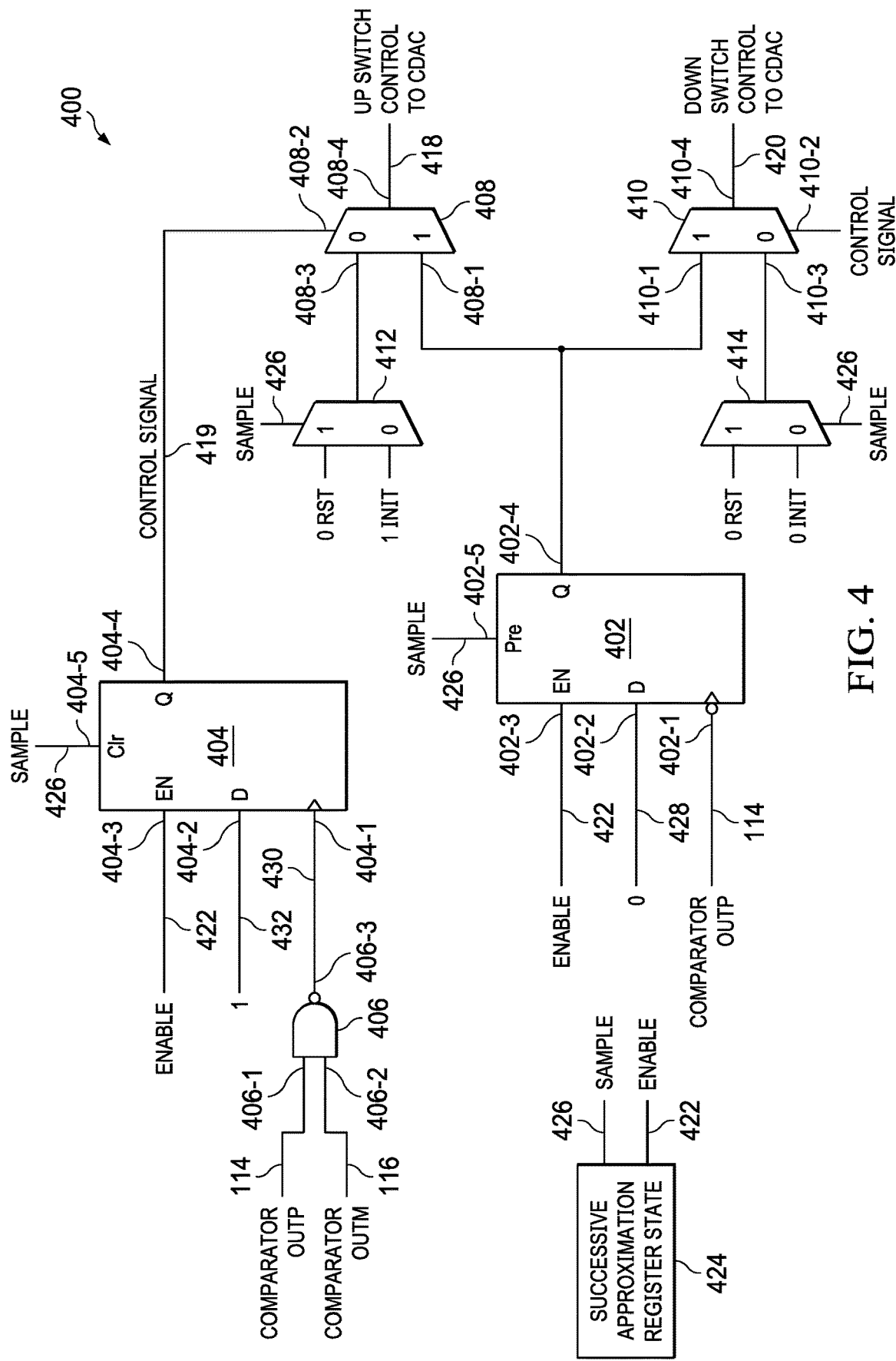
FIG. 4 shows a schematic level diagram for an example CDAC control circuit that reduces decision time in accordance with the present disclosure.

FIG. 4 shows a schematic level diagram for an example CDAC control circuit 400 that reduces decision time in accordance with the present disclosure. The CDAC control circuit 400 may be included in the SAR control circuit 108 to generate the control signals 118 and/or the control signals 120. The CDAC control circuit 400 includes a flip-flop 402, a flip-flop 404, a clock generation circuit 406, a selection circuit 408, a selection circuit 410, a selection circuit 412, and a selection circuit selection circuit 414. A SAR state circuit 424 (also referred to herein as CDAC state circuit 424) controls analog-to-digital conversion in the SAR ADC 100, and generates control signals applied in the CDAC control circuit 400.

The flip-flop 402 includes a clock input terminal 402-1, a data input terminal 402-2, an enable input terminal 402-3, a preset input terminal 402-5, and an output 402-4. The clock input terminal 402-1 is coupled to the output 106-1 of the comparator 106. In some implementations, the clock input terminal 402-1 may be coupled to the output 106-2 rather than the output 106-1. The data input terminal 402-2 is coupled to a constant voltage source. For example, the data input terminal 402-2 is coupled to ground in FIG. 4, and may be coupled to a different constant voltage source in other implementations of the CDAC control circuit 400. The enable input terminal 402-3 is coupled to the SAR state circuit 424. An enable signal 422 generated by the SAR state circuit 424 is activated to allow the flip-flop 402 to change state responsive to the output signal 114. The enable signal 422 is activated when the state of the switches 304 and 305 controlled by the CDAC control circuit 400 is to be set as part of the digitization process. The preset input terminal 402-5 is coupled to the SAR state circuit 424. A sample signal 426 generated by the SAR state circuit 424 sets the flip-flop 402 at the start of the digitization process when the CDAC 102 is sampling an analog signal to be digitized.

Some CDAC control circuits clock the state of the output signal 114 or the output signal 116 into a flip-flop using a clock derived from both the output signal 114 and the output signal 116 of the comparator 106. In such implementations, the clock must be delayed to provide adequate set-up time for the flip-flip, which extends bit decision time and increases overall digitization time. Because the data input terminal 402-2 is coupled to a constant voltage source, set-up time with respect to the output signal 114 is not an issue, and the flip-flop 402 can be clocked by an edge of the output signal 114 without additional delay. Thus, the CDAC control circuit 400 decreases bit decision time and overall digitization time by eliminating clock delay needed to provide set-up time in other implementations.

The clock generation circuit 406 combines the output signal 114 and the output signal 116 to generate a clock signal 430 for clocking the flip-flop 404. The clock generation circuit 406 includes an input 406-1 coupled to the output 106-1 of the comparator 106, and an input 406-2 coupled to the output 106-2 of the comparator 106. An output 406-3 of the clock generation circuit 406 provides the clock signal 430 to the flip-flop 404.

The flip-flop 404 includes a clock input terminal 404-1, a data input terminal 404-2, an enable input terminal 404-3, a preset input terminal 404-5, and an output 404-4. The clock input terminal 404-1 is coupled to the output 406-3 of the clock generation circuit 406. The data input terminal 404-2 is coupled to a constant voltage source. For example, the data input terminal 404-2 is coupled to a logic one voltage source in FIG. 4, and may be coupled to a different constant voltage source in other implementations of the CDAC control circuit 400. The enable input terminal 404-3 is coupled to the SAR state circuit 424. The enable signal 422 generated by the SAR state circuit 424 is activated to allow the flip-flop 404 to change state responsive to either the output signal 114 or the output signal 116. The enable signal 422 is activated when the state of the switches 304 and 305 controlled by the CDAC control circuit 400 is to be set as part of the digitization process. The preset input terminal 404-5 is coupled to the SAR state circuit 424. The sample signal 426 generated by the SAR state circuit 424 resets the flip-flop 404 at the start of the digitization process when the CDAC 102 is sampling an analog signal to be digitized. The flip-flop 404 generates a control signal 419 that controls the selection circuit 408 and the selection circuit 410.

The selection circuit 408 and selection circuit 410 route the output of the flip-flop 402 to the CDAC 102 (or the CDAC 104). The selection circuit 408 includes an input 408-1, an input 408-2, and input 408-3, and an output 408-4. The input 408-1 is coupled to the output 402-4 of the flip-flop 402. The input 408-2 is coupled the output 404-4 of the flip-flop 404. The input 408-3 is coupled to the selection circuit 412. The output 408-4 is coupled to the one of the switches 305. When the control signal 419 is active, the selection circuit 408 routes the output of the flip-flop 402 to the switches 305. When the control signal 419 is inactive, the selection circuit 408 routes the output of the selection circuit 412 to the switches 305.

The selection circuit 410 includes an input 410-1, an input 410-2, and input 410-3, and an output 410-4. The input 410-1 is coupled to the output 402-4 of the flip-flop 402. The input 410-2 is coupled the output 404-4 of the flip-flop 404. The input 410-3 is coupled to the selection circuit 414. The output 410-4 is coupled to the one of the switches 304. When the control signal 419 is active, the selection circuit 410 routes the output of the flip-flop 402 to the switches 304. When the control signal 419 is inactive, the selection circuit 410 routes the output of the selection circuit 414 to the switches 304.

Figure 5:
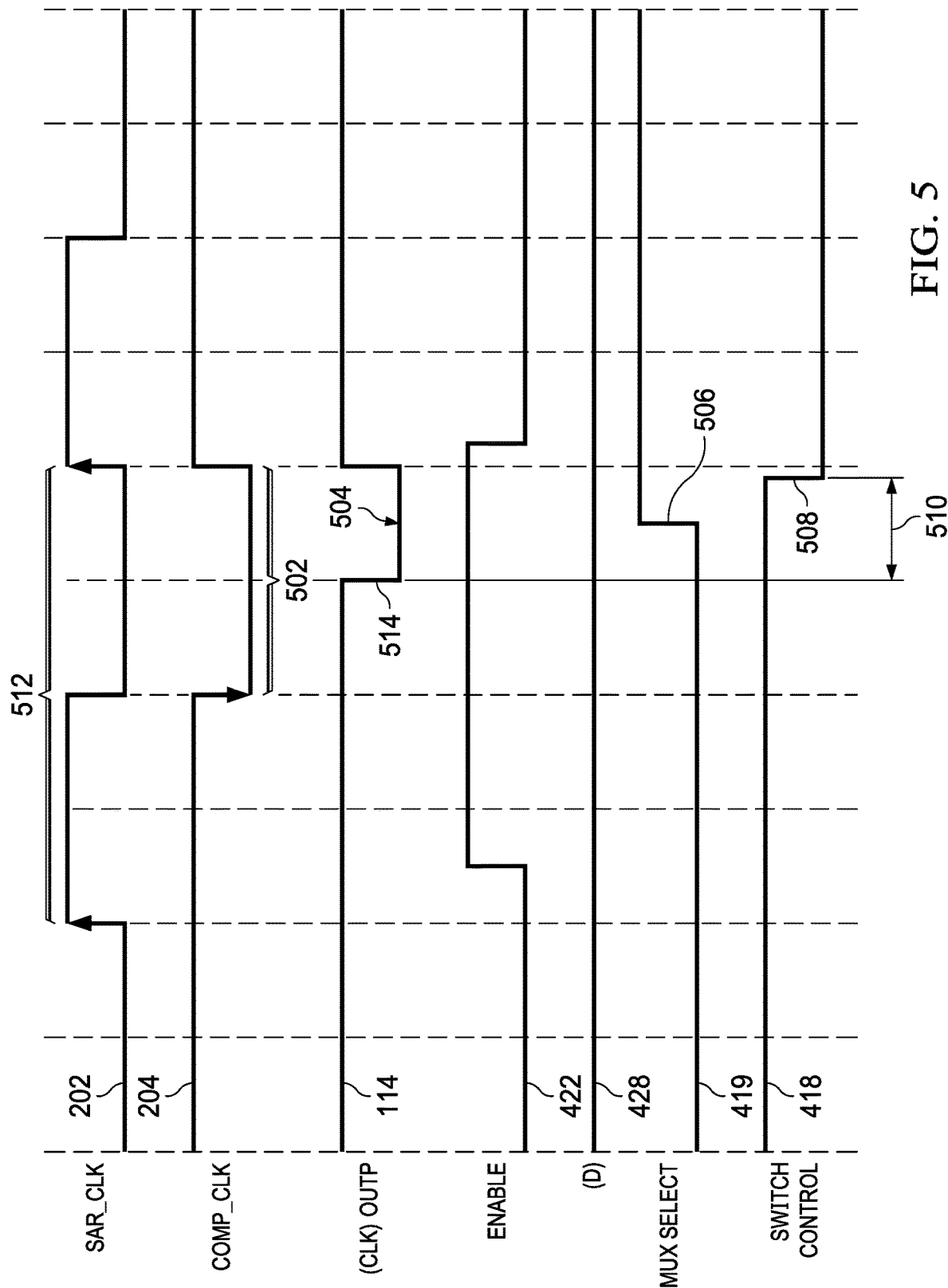
FIG. 5 shows an example timing diagram illustrating operation of the CDAC control circuit of FIG. 4.

FIG. 5 shows an example timing diagram illustrating operation of the CDAC control circuit 400 of FIG. 4. In the cycle 512 of the SAR_CLK 202, the SAR state circuit 424 activates the enable signal 422 to allow the CDAC control circuit 400 to set the state of the switches 304 and 305. In interval 502 of the COMP_CLK 204, the comparator 106 generates pulse 504 on the output signal 114. The data input terminal 402-2 of the flip-flop 402 is at constant voltage 428. Edge 514 of the pulse 504 clocks the constant voltage 428 into the flip-flop 402. At 506, the flip-flop 404 changes state responsive to the edge 514 to activate the control signal 419. The control signal 419 causes the selection circuit 408 to select the output of the flip-flop 402 to route to the switches 305, and at 508, the output signal 418 of the selection circuit 408 changes state as the output of the flip-flop 402 is routed to the switches 305.

Figure 6:
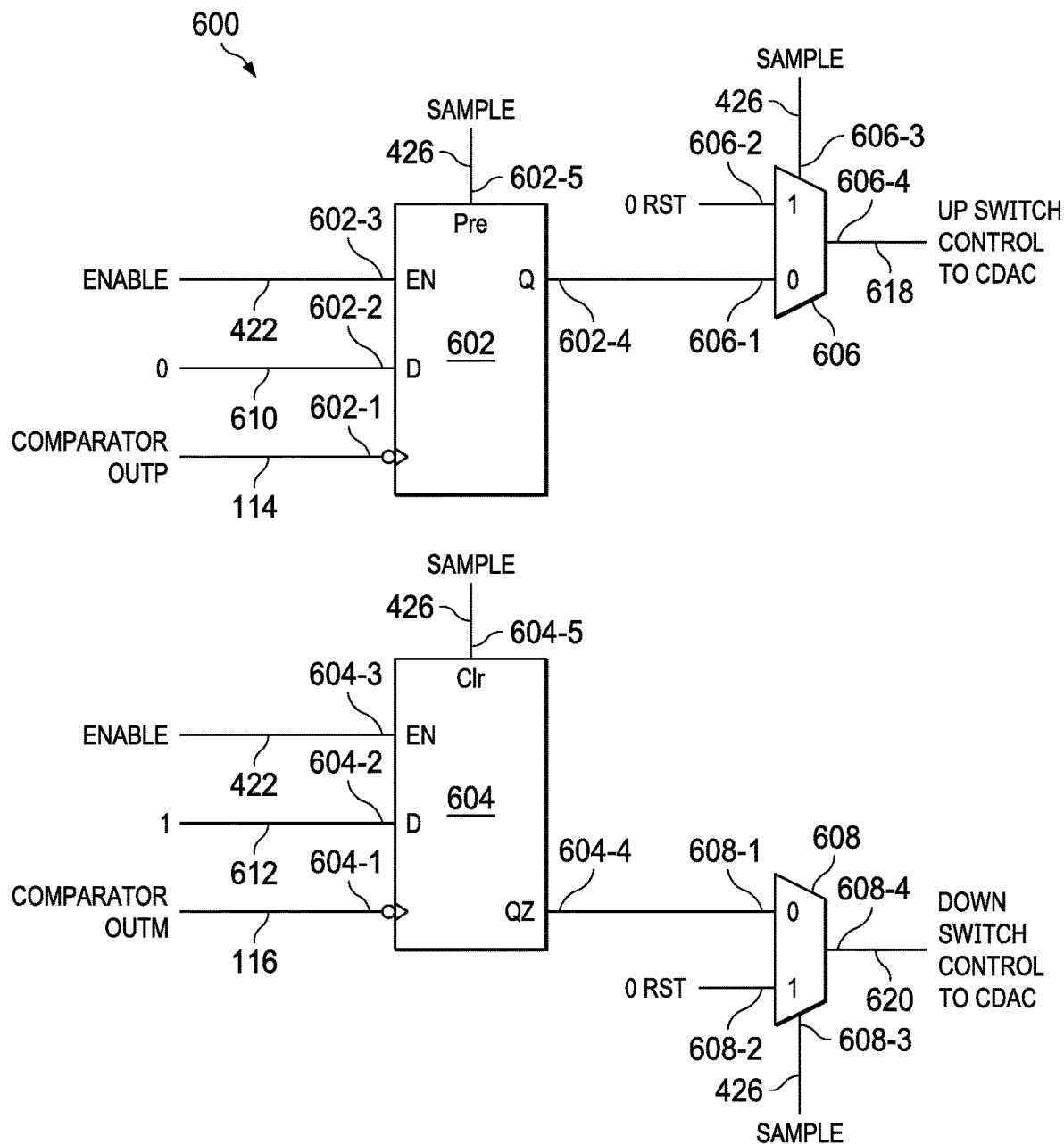
FIG. 6 shows a schematic level diagram for another example CDAC control circuit that reduces decision time in accordance with the present disclosure.

FIG. 6 shows a schematic level diagram for another example CDAC control circuit 600 that reduces decision time in accordance with the present disclosure. The CDAC control circuit 600 may be included in the SAR control circuit 108 to generate the control signals 118 and/or the control signals 120. The CDAC control circuit 600 includes a flip-flop 602, a flip-flop 604, a selection circuit 606, and a selection circuit 608. The SAR state circuit 424 (shown in FIG. 4) controls analog-to-digital conversion in the SAR ADC 100, and generates control signals applied in the CDAC control circuit 600.

The flip-flop 602 includes a clock input terminal 602-1, a data input terminal 602-2, an enable input terminal 602-3, a preset input terminal 602-5, and an output 602-4. The clock input terminal 602-1 is coupled to the output 106-1 of the comparator 106. The data input terminal 602-2 is coupled to a constant voltage source. For example, the data input terminal 602-2 is coupled to ground in FIG. 6. The enable input terminal 602-3 is coupled to the SAR state circuit 424. The enable signal 422 generated by the SAR state circuit 424 is activated to allow the flip-flop 602 to change state responsive to the output signal 114. The enable signal 422 is activated when the state of the switches 304 and 305 controlled by the CDAC control circuit 600 is to be set as part of the digitization process. The preset input terminal 602-5 is coupled to the SAR state circuit 424. The sample signal 426 generated by the SAR state circuit 424 sets the flip-flop 602 at the start of the digitization process when the CDAC 102 is sampling an analog signal to be digitized.

The flip-flop 604 includes a clock input terminal 604-1, a data input terminal 604-2, an enable input terminal 604-3, a reset input terminal 604-5, and an output 604-4. The clock input terminal 604-1 is coupled to the output 106-2 of the comparator 106. The data input terminal 604-2 is coupled to a constant voltage source. For example, the data input terminal 604-2 is coupled to a "logic one" voltage source in FIG. 6. The enable input terminal 604-3 is coupled to the SAR state circuit 424. The enable signal 422 generated by the SAR state circuit 424 is activated to allow the flip-flop 604 to change state responsive to the output signal 116. The enable signal 422 is activated when the state of the switches 304 and 305 controlled by the CDAC control circuit 600 is to be set as part of the digitization process. The reset input terminal 604-5 is coupled to the SAR state circuit 424. The sample signal 426 generated by the SAR state circuit 424 resets the flip-flop 604 at the start of the digitization process when the CDAC 102 is sampling an analog signal to be digitized.

Like the CDAC control circuit 400, the CDAC control circuit 600 eliminates set-up time delay by applying a constant voltage to the data input terminals of the flip-flop 602 and the flip-flop 604. The CDAC control circuit 600 also reduces the loading on the flip-flops, as the flip-flop 602 and flip-flop 604 each drive only one load. Thus, the CDAC control circuit 600 decreases bit decision time and overall digitization time by eliminating clock delay.

The selection circuit 606 routes the output of the flip-flop 602 to the CDAC 102 (or the CDAC 104). Similarly, the selection circuit 608 routes the output of the flip-flop 604 to the CDAC 102 (or the CDAC 104). The selection circuit 606 includes an input 606-1, an input 606-2, an input 606-3, and an output 606-4. The input 606-1 is coupled to the output 602-4 of the flip-flop 602. The input 606-2 is coupled to a constant voltage source, such as ground. The input 606-3 is coupled to the SAR state circuit 424. The output 606-4 is coupled to the one of the switches 305. When the sample signal 426 is inactive, the selection circuit 606 routes the output of the flip-flop 602 to the switches 305. When the sample signal 426 is active, the selection circuit 606 routes the voltage at the input 606-2 to the switches 305.

The selection circuit 608 includes an input 608-1, an input 608-2, an input 608-3, and an output 608-4. The input 608-1 is coupled to the output 604-4 of the flip-flop 604. The input 608-2 is coupled to a constant voltage source, such as ground. The input 608-3 is coupled to the SAR state circuit 424. The output 608-4 is coupled to the one of the switches 304. When the sample signal 426 is inactive, the selection circuit 608 routes the output of the flip-flop 604 to the switches 304. When the sample signal 426 is active, the selection circuit 608 routes the voltage at the input 608-2 to the switches 304.

Figure 7:
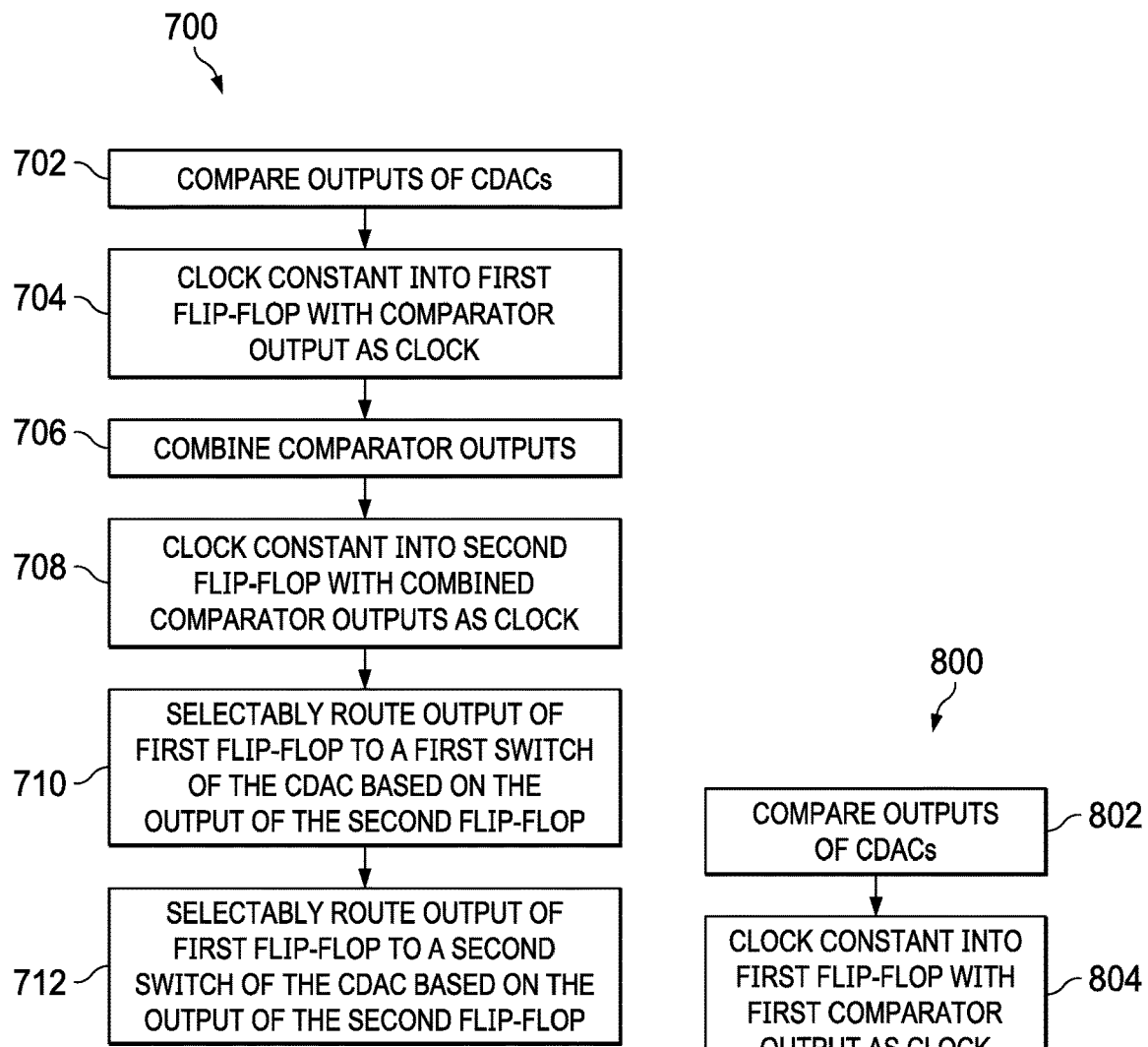
FIGS. 7 and 8 show flow diagrams for example methods for controlling a CDAC in accordance with the present disclosure.

FIG. 7 shows a flow diagram for an example method 700 for controlling a CDAC 300 in accordance with the present disclosure. Though depicted sequentially as a matter of convenience, at least some of the actions shown can be performed in a different order and/or performed in parallel. Additionally, some implementations may perform only some of the actions shown. Operations of the method 700 may be performed by an implementation of the SAR ADC 100 that includes the CDAC control circuit 400.

In block 702, the SAR ADC 100 is digitizing an analog signal. The CDAC 102 and the CDAC 104 are generating analog output signal 110 and analog output signal 112, and the comparator 106 compares the analog output signal 110 and the analog signal analog output signal 112. The comparator 106 generates a pulse on the output signal 114 or the output signal 116 as a result of the comparison.

In block 704, the constant voltage 428 is clocked into the flip-flop 402 at an edge of the output signal 114 to generate a signal for controlling the switches 304 and 305. The edge of the output signal 114 is not delayed to provide set-up time at the data input terminal 402-2 of the flip-flop 402.

In block 706, the clock generation circuit 406 combines the output signal 114 and the output signal 116 to generate a clock signal 430 for clocking the flip-flop 404.

In block 708, the constant voltage 432 is clocked into the flip-flop 404 at an edge of the clock signal 430 to generate the control signal 419 for controlling the selection circuit 408 and the selection circuit 410.

In block 710, the selection circuit 408 selectably routes the output signal generated by the flip-flop 402 to the switches 305. The routing of the selection circuit 408 is controlled by the control signal 419. The output signal 418 controls switching of a reference voltage to a capacitor 303 of the CDAC 300.

In block 712, the selection circuit 410 selectably routes the output signal generated by the flip-flop 402 to the switches 304. The routing of the selection circuit 410 is controlled by the control signal 419. The output signal 420 controls switching of a reference voltage to a capacitor 302 of the CDAC 300.

Figure 8:
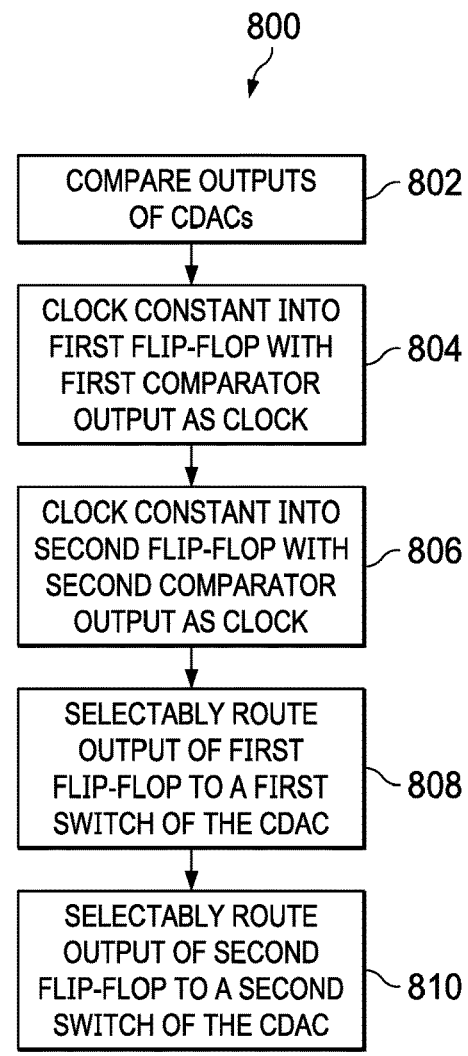

FIG. 8 shows a flow diagram for an example method 800 for controlling a CDAC 300 in accordance with the present disclosure. Though depicted sequentially as a matter of convenience, at least some of the actions shown can be performed in a different order and/or performed in parallel. Additionally, some implementations may perform only some of the actions shown. Operations of the method 800 may be performed by an implementation of the SAR ADC 100 that includes the CDAC control circuit 600.

In block 802, the SAR ADC 100 is digitizing an analog signal. The CDAC 102 and the CDAC 104 are generating analog output signal 110 and analog output signal 112, and the comparator 106 compares the analog output signal 110 and the analog signal analog output signal 112. The comparator generates a pulse on the output signal 114 or the output signal 116 as a result of the comparison.

In block 804, the constant voltage 610 is clocked into the flip-flop 602 at an edge of the output signal 114 to generate a signal for controlling the switches 305. The edge of the output signal 114 is not delayed to provide set-up time at the data input terminal 602-2.

In block 806, the constant voltage 612 is clocked into the flip-flop 604 at an edge of the output signal 116 to generate a signal for controlling the switches 304. The edge of the output signal 116 is not delayed to provide set-up time at the data input terminal 602-2. In any given cycle of the SAR_CLK 202, the comparator 106 generates a pulse on only one of the output signal 114 or the output signal 116.

In block 808, the selection circuit 606 selectably routes the output signal generated by the flip-flop 602 to the switches 305. The routing of the selection circuit 606 is controlled by the sample signal 426. The output signal 618 controls switching of a reference voltage to a capacitor 303 of the CDAC 300.

In block 810, the selection circuit 608 selectably routes the output signal generated by the flip-flop 604 to the switches 304. The routing of the selection circuit 608 is controlled by the sample signal 426. The output signal 620 controls switching of a reference voltage to a capacitor 302 of the CDAC 300.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
   a capacitive digital-to-analog converter (CDAC);
   a comparator coupled to an output of the CDAC; and
   a successive approximation register (SAR) control circuit coupled to an output of the comparator and to an input of the CDAC, the SAR control circuit comprising:
      a flip-flop comprising:
         a clock input terminal coupled to the output of the comparator;

a data input terminal coupled to a constant voltage source; and
an output coupled to the CDAC;
wherein:
the flip-flop is a first flip-flop;
the constant voltage source is a first constant voltage source; and
the SAR control circuit comprises:
a second flip-flop comprising:
a clock input terminal coupled to a plurality of outputs of the comparator;
a data input terminal coupled to a second constant voltage source; and
an output coupled to the CDAC.

2. The ADC of claim 1, wherein the SAR control circuit comprises a clock generation circuit comprising:
a first input coupled to a first output of the comparator;
a second input coupled to a second output of the comparator; and
an output coupled to the clock input terminal of the second flip-flop.

3. The ADC of claim 1, wherein the SAR control circuit further comprises:
a first selection circuit comprising:
a first input coupled to the output of the first flip-flop;
a second input coupled to the output of the second flip-flop;
a third input coupled to a second selection circuit; and
an output coupled to the CDAC.

4. The ADC of claim 3, wherein the SAR control circuit further comprises:
a third selection circuit comprising:
a first input coupled to the output of the first flip-flop;
a second input coupled to the output of the second flip-flop;
a third input coupled to a fourth selection circuit; and
an output coupled to the CDAC.

5. An analog-to-digital converter (ADC), comprising:
a capacitive digital-to-analog converter (CDAC);
a comparator coupled to an output of the CDAC; and
a successive approximation register (SAR) control circuit coupled to an output of the comparator and to an input of the CDAC, the SAR control circuit comprising:
a flip-flop comprising:
a clock input terminal coupled to the output of the comparator;
a data input terminal coupled to a constant voltage source; and
an output coupled to the CDAC;
wherein:
the flip-flop is a first flip-flop;
the constant voltage source is a first constant voltage source;
the output of the first flip-flop is coupled to a first input of the CDAC;
the clock input terminal of the first flip-flop is coupled to a first output of the comparator; and
the SAR control circuit comprises a second flip-flop comprising:
a clock input terminal coupled to a second output of the comparator;
a data input terminal coupled to a second constant voltage source; and
an output coupled to a second input of the CDAC.

6. The ADC of claim 5, wherein the SAR control circuit further comprises:
a first selection circuit comprising:

a first input coupled to the output of the first flip-flop;
a second input coupled to a SAR state circuit;
an output coupled to the first input of the CDAC; and
a second selection circuit comprising:
a first input coupled to the output of the second flip-flop;
a second input coupled to the SAR state circuit; and
an output coupled to the second input of the CDAC.

7. A capacitive digital-to-analog converter (CDAC) circuit, comprising:
a CDAC comprising:
a plurality of capacitors; and
a plurality of switches coupled to the capacitors; and
a control circuit coupled to the CDAC, and comprising:
a flip-flop comprising:
a clock input terminal coupled to an output of a comparator;
a data input terminal coupled to a constant voltage source; and
an output coupled to a first of the switches;
wherein:
the flip-flop is a first flip-flop;
the constant voltage source is a first constant voltage source; and
the control circuit comprises:
a second flip-flop comprising:
a clock input terminal coupled to a plurality of outputs of the comparator;
a data input terminal coupled to a second constant voltage source; and
an output coupled to the CDAC.

8. The CDAC circuit of claim 7, wherein the control circuit comprises a clock generation circuit comprising:
a first input coupled to a first output of the comparator;
a second input coupled to a second output of the comparator; and
an output coupled to the clock input terminal of the second flip-flop.

9. The CDAC circuit of claim 7, wherein the control circuit further comprises:
a first selection circuit comprising:
a first input coupled to the output of the first flip-flop;
a second input coupled to the output of the second flip-flop;
a third input coupled to a second selection circuit; and
an output coupled to the CDAC.

10. The CDAC circuit of claim 9, wherein the control circuit further comprises:
a third selection circuit comprising:
a first input coupled to the output of the first flip-flop;
a second input coupled to the output of the second flip-flop;
a third input coupled to a fourth selection circuit; and
an output coupled to the CDAC.

11. A capacitive digital-to-analog converter (CDAC) circuit, comprising:
a CDAC comprising:
a plurality of capacitors; and
a plurality of switches coupled to the capacitors; and
a control circuit coupled to the CDAC, and comprising:
a flip-flop comprising:
a clock input terminal coupled to an output of a comparator;
a data input terminal coupled to a constant voltage source; and
an output coupled to a first of the switches;
wherein:

the flip-flop is a first flip-flop;
the constant voltage source is a first constant voltage source;
the clock input terminal of the first flip-flop is coupled to a first output of the comparator; and
the control circuit comprises a second flip-flop comprising:
- a clock input terminal coupled to a second output of the comparator;
- a data input terminal coupled to a second constant voltage source; and
- an output coupled to a second of the switches.

12. The CDAC circuit of claim 11, further comprising:
a first selection circuit comprising:
- a first input coupled to the output of the first flip-flop;
- a second input coupled to a CDAC state circuit; and
- an output coupled to the first of the switches; and
a second selection circuit comprising:
- a first input coupled to the output of the second flip-flop;
- a second input coupled to the CDAC state circuit; and
- an output coupled to the second of the switches.

13. A method, comprising:
comparing, by a comparator circuit, output of a first capacitive digital-to-analog converter (CDAC) and output of a second CDAC;
applying a signal generated at an output of the comparator circuit as a clock signal to clock a constant value into a flip-flop; and
routing an output signal generated by the flip-flop to the CDAC, wherein the output signal controls switching of a reference voltage to a capacitor of the CDAC;
wherein:
the flip-flop is a first flip-flop; and
the constant value is a first constant value; and
the method further comprises:
combining the signal generated at the first output of the comparator circuit and a signal generated at a second output of the comparator circuit to generate a clock signal; and
applying the clock signal to clock a second constant value into a second flip-flop.

14. The method of claim 13, further comprising selectively routing, based on an output of the second flip-flip, the output signal generated by the first flip-flop to control a first switch of the CDAC.

15. The method of claim 14, further comprising selectively routing, based on the output of the second flip-flip, the output signal generated by the first flip-flop to control a second switch of the CDAC.

16. A method, comprising:
comparing, by a comparator circuit, output of a first capacitive digital-to-analog converter (CDAC) and output of a second CDAC;
applying a signal generated at an output of the comparator circuit as a clock signal to clock a constant value into a flip-flop; and
routing an output signal generated by the flip-flop to the CDAC, wherein the output signal controls switching of a reference voltage to a capacitor of the CDAC;
wherein:
the flip-flop is a first flip-flop;
the constant value is a first constant value;
the capacitor is a first capacitor;
the output of the comparator circuit is a first output of the comparator circuit; and
the reference voltage is a first reference voltage; and
the method further comprises:
applying a signal generated at a second output of the comparator circuit as a clock signal to clock a second constant value into a second flip-flip; and
routing an output signal generated by the second flip-flop to the CDAC, wherein the output signal controls switching of the reference voltage to a second capacitor of the CDAC.

17. The method of claim 16, further comprising:
selectively routing the output signal generated by the first flip-flop to a first switch of the CDAC; and
selectively routing the output signal generated by the second flip-flop to a second switch of the CDAC.

* * * * *